United States Patent
Moser et al.

[11] Patent Number: 5,900,728
[45] Date of Patent: May 4, 1999

[54] ALTERNATING CURRENT MAGNETIC FORCE MICROSCOPY SYSTEM WITH PROBE HAVING INTEGRATED COIL

[75] Inventors: Andreas Moser; Dieter Klaus Weller, both of San Jose, Calif.

[73] Assignee: International Business Machines Corporation, Armonk, N.Y.

[21] Appl. No.: 08/821,982

[22] Filed: Mar. 20, 1997

[51] Int. Cl.$^6$ .................................................. G01R 33/02
[52] U.S. Cl. .......................... 324/244; 324/260; 250/306
[58] Field of Search ................... 324/244, 260, 324/261, 262, 226; 250/306, 307

[56] References Cited

U.S. PATENT DOCUMENTS

| | | | |
|---|---|---|---|
| 4,722,073 | 1/1988 | Lampe et al. | 365/87 |
| 5,171,992 | 12/1992 | Clabes et al. | 250/306 |
| 5,266,897 | 11/1993 | Watanuki et al. | 324/244 |
| 5,343,422 | 8/1994 | Kung et al. | 365/173 |
| 5,347,485 | 9/1994 | Taguchi et al. | 365/171 |
| 5,361,226 | 11/1994 | Taguchi et al. | 365/171 |
| 5,432,734 | 7/1995 | Kawano et al. | 365/158 |
| 5,436,448 | 7/1995 | Hosaka et al. | 250/306 |
| 5,448,515 | 9/1995 | Fukami et al. | 365/171 |
| 5,449,935 | 9/1995 | Nakamura | 257/295 |
| 5,454,158 | 10/1995 | Fontana, Jr. et al. | 29/603 |
| 5,465,046 | 11/1995 | Campbell et al. | 324/244 |
| 5,486,963 | 1/1996 | Jones, Jr. | 360/104 |

OTHER PUBLICATIONS

P. Grütter et al., "Magnetic Force Microscopy with Batch-fabricated Force Sensors", *Journal of Applied Physics*, vol. 69, No. 8, Apr. 15, 1991, pp. 5883–5885.

Y. Martin et al., "High–resolution Magnetic Imaging of Domains in TbFe by Force Microscopy", *Applied Physics Letters*, vol. 52, No. 3, Jan. 18, 1988, pp. 244–246.

C. M. Mate et al., "Summary Abstract: Atomic Force Microscopy Studies of Frictional Forces and of Force Effects in Scanning Tunneling Microscopy", *Journal of Vacuum Science Technology A*, vol. 6, No. 3, May/Jun. 1988, pp. 575–576.

D. Rugar et al., "Force Microscope Using a Fiber–optic Displacement Sensor", *Review of Scientific Instruments*, vol. 59, No. 11, Nov. 1988, pp. 2337–2340.

*Primary Examiner*—Walter E. Snow
*Attorney, Agent, or Firm*—Thomas R. Berthold

[57] ABSTRACT

An alternating current (AC) magnetic force microscopy (MFM) system incorporates an improved probe with an integrated coil on the free end of the system's cantilever. The probe has a pair of magnetic poles that form part of a magnetic yoke and a patterned electrically conductive coil wound through the yoke. The probe includes a probe tip that has a magnetic surface layer that is magnetically coupled to one of the poles and extends from it. When alternating current from the AC-MFM system is passed through the probe coil the magnetization direction of the probe tip correspondingly alternates. The interaction of these alternating magnetic fields from the probe tip with the magnetic fields emanating from the sample whose magnetic fields are to be measured causes the cantilever to deflect between two extreme positions. The probe can be formed from a portion of a disk drive air-bearing slider with a patterned thin film inductive write head on its trailing end by growing the probe tip from the slider's air-bearing surface so as to be in contact with the gap and one of the poles of the write head. The probe can also be part of an integrated single-piece structure that includes the cantilever, probe body and probe tip which are formed using conventional thin film deposition and lithographic processes.

16 Claims, 5 Drawing Sheets

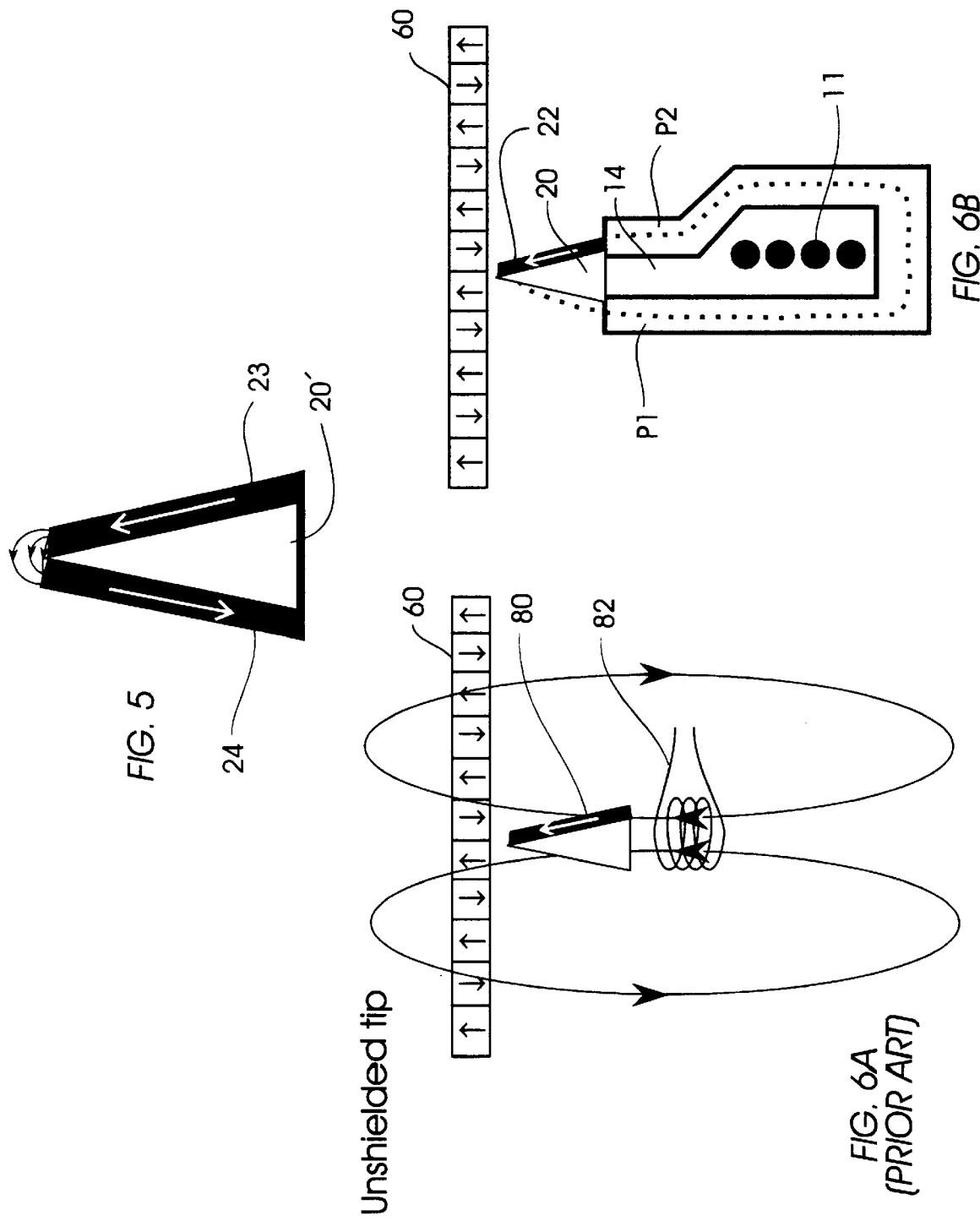

ALTERNATING CURRENT MAGNETIC FORCE MICROSCOPY SYSTEM WITH PROBE HAVING INTEGRATED COIL

RELATED APPLICATION

This application is related to concurrently filed application Ser. No. 08/821,985, titled "MAGNETIC FORCE MICROSCOPY PROBE WITH INTEGRATED COIL", filed Mar. 20, 1997.

TECHNICAL FIELD

This invention relates to magnetic force microscopy (MFM) and more particularly to an MFM system that operates in alternating current (AC) mode.

BACKGROUND OF THE INVENTION

Magnetic force microscopy (MFM) is a development of the noncontact surface analysis type of atomic force microscopy (AFM). MFM is well established as a technique for determining the magnetic fields emanating from thin films, such as magnetic recording media. In an MFM system, a sharp magnetic tip is mounted on a cantilever force sensor which is placed over the surface of the magnetic specimen while the specimen is scanned by a conventional XYZ scanning stage. The magnetic forces that act on the tip from the sample cause a static deflection of the cantilever. These forces are monitored, typically by use of a laser detection system wherein the deflection of the cantilever causes a displacement of a reflected laser light beam. MFM using a magnetized iron tip is described by Martin et al., "High-resolution Magnetic Imaging of Domains in TbFe by Force Microscopy", *Appl. Phys. Lett.*, Vol. 52, No. 3, Jan. 18, 1988, pp. 244–246. The use of silicon tips coated with a film of magnetic material, such as NiFe or CoPtCr, in MFM is described by Grütter et al., "Magnetic Force Microscopy with Batch-fabricated Force Sensors", *J. Appl. Phys.*, Vol. 69, No. 8, Apr. 15, 1991, pp. 5883–5885.

In U.S. Pat. No. 5,436,448, a modification of this type of conventional static MFM system is shown and described in FIG. 7 of the patent. In this modified MFM system, a coil is wrapped around the cantilever having a magnetic tip on its end. Alternating current (AC) is passed through the coil which causes the magnetization of the tip to switch directions. The magnetic force data obtained with one polarity and those obtained with the other polarity are subtracted from each other to improve the resolution of the MFM system. The disadvantages of this AC-MFM system are that the magnetic field from the coil cannot be concentrated at the tip because of its physical distance from the tip, and the stray magnetic fields from the coil interact with the magnetic fields from the sample.

What is needed is an improved AC-MFM probe and AC-MFM system wherein the magnetic field can be concentrated at the probe tip and the magnetic field can be alternated at the probe tip to improve the resolution of the MFM system without stray fields from the coil affecting the magnetic sample.

SUMMARY OF THE INVENTION

The invention is an AC-MFM system with an improved probe. The probe is located on the free end of a cantilever and has a pair of magnetic poles that form part of a magnetic yoke and a patterned electrically conductive coil wound through the yoke. The probe includes a probe tip that has a magnetic surface layer that is magnetically coupled to one of the poles and extends from it. When the AC-MFM system passes alternating current through the probe coil the magnetization direction of the probe tip correspondingly alternates. The interaction of these alternating magnetic fields from the probe tip with the magnetic fields from the magnetic sample causes the cantilever to deflect between two extreme positions. In the preferred embodiment the probe is formed from a portion of a disk drive air-bearing slider with a patterned thin film inductive write head on its trailing end. The probe tip is grown from the slider's air-bearing surface so as to be in contact with the gap and one of the poles of the write head. The probe is then attached to a conventional AFM cantilever. In an alternative embodiment, the cantilever, probe body and probe tip are all formed as an integrated single-piece structure using conventional thin film deposition and lithographic processes.

An alternative probe tip has two magnetic surfaces, with each surface being in contact with a corresponding pole. The end of the probe tip is removed so that nonmagnetic material is located between the two magnetic surfaces at the end of the tip. In this embodiment of the probe tip the magnetic field induced by the coil bridges the nonmagnetic gap between the two magnetic surfaces at the probe tip.

The use of a patterned film coil that is integrated with the magnetic poles and shielded by the probe body, as in a conventional thin film inductive write head on a slider body, and the location of the coil near the probe tip allows the magnetic field to be concentrated at the probe tip and prevents the generation of stray magnetic fields from the coil that would interfere with the magnetic fields from the sample.

For a fuller understanding of the nature and advantages of the present invention, reference should be made to the following detailed description taken together with the accompanying figures.

BRIEF DESCRIPTION OF THE DRAWING

FIG. 5 is a representation of an alternative probe tip with two magnetic surfaces showing the magnetization directions of the two surfaces for generating magnetic flux at the tip end.

FIG. 6A is a schematic of an unshielded coil in an AC-MFM system showing interaction with the magnetic sample.

FIG. 6B is a schematic of the probe of the present invention showing how the fields from the coil are inherently shielded from interaction with the magnetic sample.

DESCRIPTION OF THE PREFERRED EMBODIMENTS

Figure 1:
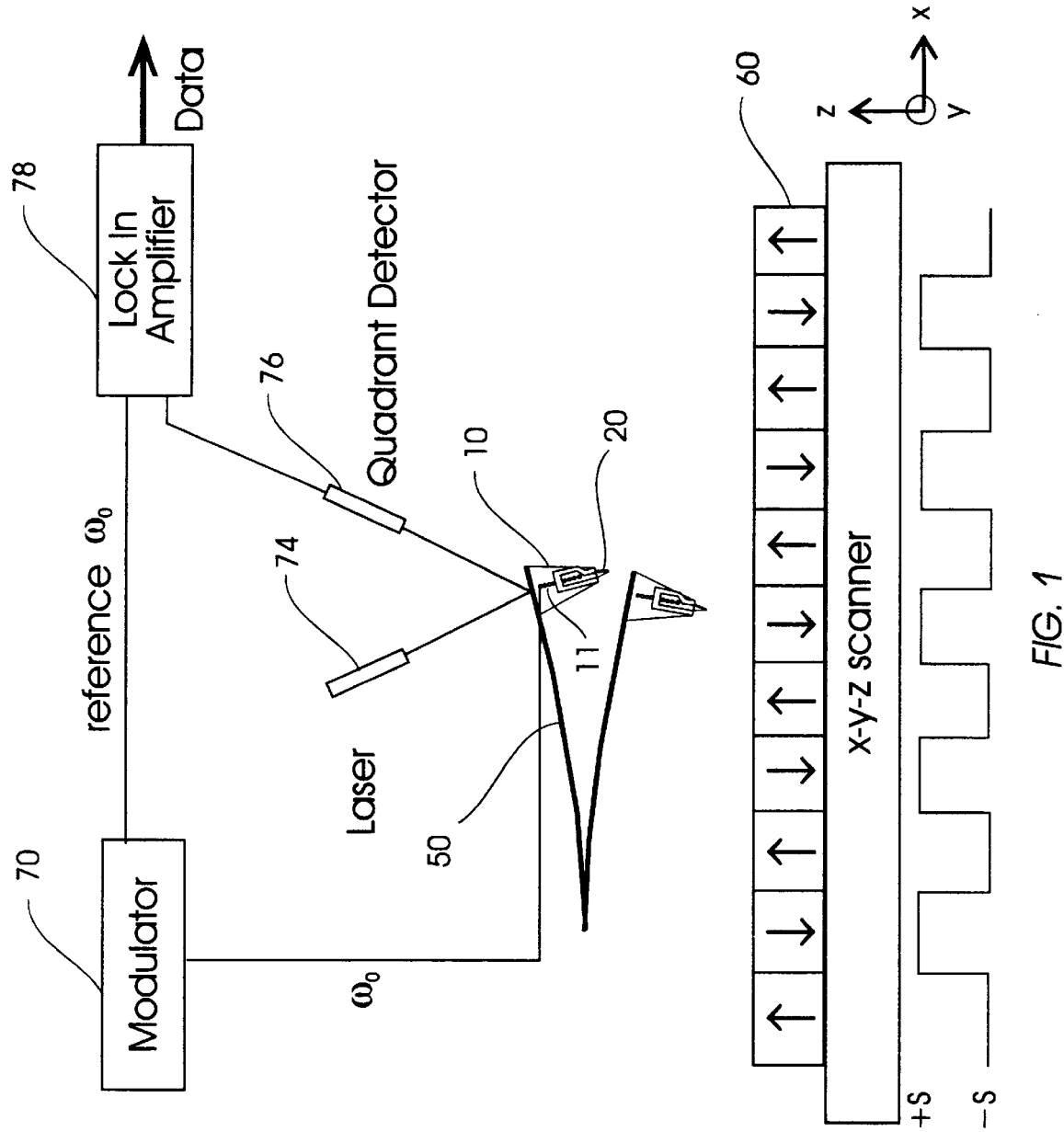
FIG. 1 is a schematic of the MFM system according to the present invention.

The magnetic force microscopy (MFM) system of the present invention is shown schematically in FIG. 1. The MFM system includes the MFM probe 10 of the present invention, which is attached to a flexible cantilever 50. The probe 10 and cantilever 50 are depicted in FIG. 1 with the probe 50 in its two extreme positions, one where it is closest to the surface of a sample 60 and the other where it is located farthest from the surface of sample 60. The sample 60 may be any type of magnetic material, but is depicted in FIG. 1 as a sample of perpendicular recording magnetic thin film. The sample 60 is supported on a conventional XYZ scanner of the type used in MFM systems. The XYZ scanner is a piezo device that is moved in the XY direction so that the tip 20 of probe 10 can be located over different XY positions of the sample 60. The distance between the tip 20 of the probe 10 and the surface of the sample is maintained fixed by the scanner controlling the Z position of the sample 60. MFM systems also exist wherein the sample is fixed and the cantilever with probe is attached to an XYZ scanner. The probe 10 also includes an electrically-conductive coil 11 which is connected to a modulator 70. Modulator 70 is a commercially available pulse generator, such as a Hewlett-Packard Model 8116A Pulse/Function Generator, that generates current pulses to the coil 11 at a fixed frequency ($\omega_0$. Thus the MFM system in FIG. 1 is a AC-MFM system. A laser source 74 generates a laser light beam to the back of cantilever 50, and a quadrant detector 76 detects light reflected from the cantilever 50. A lock-in amplifier 78 measures the phase and peak-to-peak amplitude of the input signal from quadrant detector 76 at the frequency $\omega_0$. The output of the lock-in amplifier 78 corresponds to the data representing the signal from probe 10. This signal is representative of the force due to the interaction between the magnetic fields from the magnetic domains in the sample 60 and the magnetic field at the probe tip 20 due to magnetizing of the probe tip 20 by the coil 11.

As an alternative to the reflected laser light detection technique, the deflection of cantilever 50 can also be detected by the use of the known AFM measurement techniques based upon tunneling current, capacitance, fiber interferometry and piezoresistance. The use of tunneling current measurement for cantilever deflection measurement in an MFM system is described in IBM's U.S. Pat. No. 5,266,897. The use of a capacitive deflection detector is described by C. M. Mate et al., "Atomic Force Microscopy Studies of Frictional Forces and of Force Effects in Scanning Tunneling Microscopy", *J. Vac. Sci. Technol. A*, 1988, Vol. 6, p. 575. The use of a fiber interferometry deflection detection technique is described by D. Rugar et al., "Force Microscope Using a Fiber-Optic Displacement Sensor", *Rev. Sci. Instr.*, 1988, Vol. 59, p. 2337. The use of a piezoresistive AFM cantilever is described in U.S. Pat. No. 5,345,815 assigned to Stanford University. The piezoresistive cantilever is formed of single-crystal silicon which is implanted with a dopant to provide a piezoresistive region along the length of the cantilever and deflection of the free end of the cantilever produces stress in the cantilever, which changes the electrical resistance of the piezoresistive region in proportion to the cantilever's deflection.

In operation, the MFM system is set up prior to measurement of the sample by first placing the probe tip 20 in contact with the surface of sample 60. The scanner then moves the sample along a line in the fast scan direction (typically either the X or Y direction). The output of the quadrant detector 76, without the application of any modulation from modulator 70, is then recorded as a surface profile along the scan line and later used to control the Z position of the scanner. The scanner is then moved away from the probe tip 20 in the Z direction to a distance of about 10 to 50 nm. Then during scanning, the recorded profile is followed, thereby maintaining the distance between the probe tip 20 and the surface of the sample 60 essentially constant during scanning.

As the scanner moves the sample along a line, the modulator 70 switches the current to change the magnetization of probe tip 20 in opposite directions at the frequency $\omega_0$. Then, as a result of the strength and directions of the magnetic fields from the regions of the sample 60 along the scan line, the probe tip 20 is deflected downward and upward between two extreme positions. The quadrant detector 76 detects deflection of the cantilever during scanning and provides a signal to lock-in amplifier 78. The lock-in amplifier 78 detects the phase and peak-to-peak amplitude of the signal from quadrant detector 76 at the frequency $\omega_0$. The actual value of s is the data output of lock-in amplifier 78. The data is depicted beneath the XYZ scanner in FIG. 1 in alignment with the magnetic field directions of the sample 60, as shown by the arrows. The value of s at each XY position thus determines the sign and strength of the magnetic fields in the sample 60 at the corresponding points on the surface of sample 60. In the preferred embodiment wherein the coil 11 is the coil on a conventional thin film inductive write head, the current to coil 11 is modulated between a plus and minus current level in the range of approximately 40–100 milliamps.

Figure 2B:
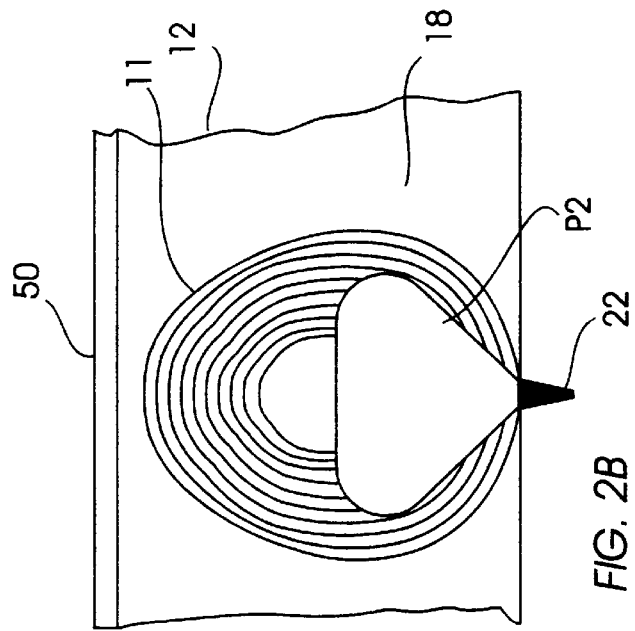
FIG. 2B is a end view of the MFM probe according to the present invention.
Figure 2A:
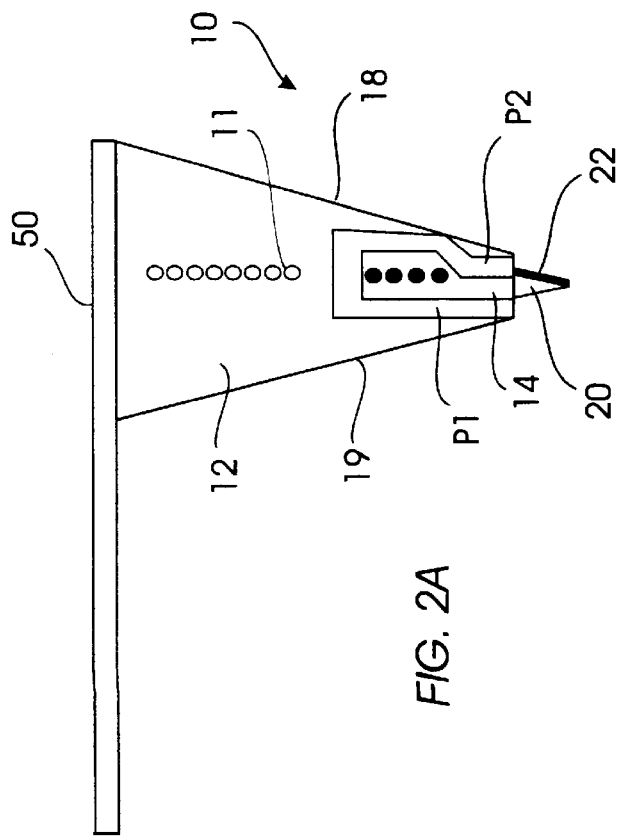
FIG. 2A is a side view of the MFM probe according to the present invention.

Referring now to FIG. 2A, there is illustrated a side sectional view of the probe 10 attached to cantilever 50. In the preferred embodiment, the probe 10 comprises a portion of a conventional air-bearing slider of the type used in magnetic recording disk drives. The slider has on its trailing end an inductive write head, which is made up of a pair of poles and an inductive coil. The coil and poles are formed using conventional lithographic techniques, as is well known in the manufacture of thin film inductive write heads. As shown in FIG. 2A, such a thin film inductive write head is depicted as having a portion 12 of a slider body and a pair of poles P1 and P2, which are spaced apart by a nonmagnetic gap 14. The poles P1 and P2 are interconnected to form a yoke through which the coil 11 passes. In FIG. 2A, the sectioned ends of the coil windings are shown in end view as coil 11. When current passes through coil 11, a magnetic field is induced in the yoke and magnetic flux is generated between the poles P1, P2 across gap 14 just as in the conventional thin film inductive write head. The coil 11 can be "wound" around or through the yoke interconnecting the poles, as in FIG. 2A, or around one of the poles, but in all embodiments at least a portion of the coil is located between the poles so that the coil current can induce a magnetic flux between the ends of the poles.

The slider body material is typically an alumina/titanium carbide composite. The gap material in gap 14 is typically formed of alumina. The material for poles P1 and P2 is preferably permalloy (Ni-Fe) but can also be other Ni-Fe alloys or Fe-N alloys. The coil 11 is formed of copper or other suitable electrically conductive material. The slider has a trailing end 18 onto which the conventional inductive write head has been lithographically formed. The slider, however, has been sliced along plane 19 so that only a portion of the slider is used to form the body 12 of probe 10. The coil 11 and pole P1 are shown on the trailing end of body 12 in the end view of FIG. 2B.

A tip 20, which is formed in contact with at least one of the poles P1 or P2 and preferably also in contact with the end surface of the gap 14, extends from the air-bearing surface (ABS) of the slider in the region of the ends of poles P1 and P2. The probe tip 20 has at least one surface or side 22 which is in contact with one of the poles (P2 shown in FIG. 2A) and is formed of a magnetic material. The probe tip 20 is shown as having a generally conical shape, but its actual shape can vary, depending on the fabrication process used, as explained below.

Figure 3B:
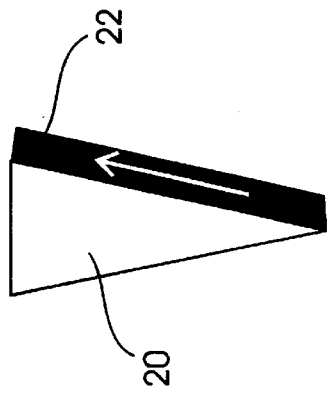
FIG. 3B is a representation of the MFM probe tip showing the magnetization direction of the magnetic surface of the probe tip in the opposite direction.
Figure 3A:
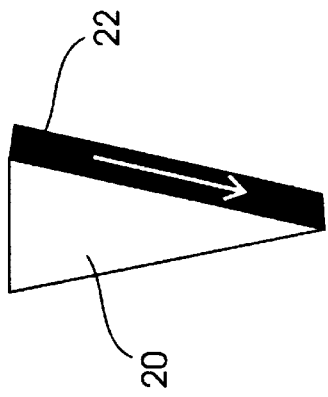
FIG. 3A is a representation of the MFM probe tip showing the magnetization direction of the magnetic surface of the probe tip in one direction.

As can be understood from FIGS. 2A–2B, when the coil 11 receives current from the modulator 70 (FIG. 1), a magnetic field is induced which causes the magnetization of the pole tip 20 with magnetic surface 22 to have a direction in one preferred direction. When the modulator 70 causes the direction of the current to be switched through the coil 11, the direction of magnetization of the probe tip 20 is reversed. These two magnetic states are shown schematically in FIGS. 3A–3B.

The probe 10 and cantilever 50 are fabricated in the following manner. A conventional air-bearing slider of the type ready for incorporation into a conventional magnetic recording disk drive is sliced along plane 19 (FIG. 2A) to form a probe body 12. The probe body 12 is bonded, using a conventional epoxy adhesive, to a silicon nitride cantilever 50. The cantilever 50 can be a commercially-available AFM cantilever, such as those supplied by Digital Instruments and Park Scientific. The cantilever 50 may also be formed of alternative materials, such as single-crystal semiconductor grade silicon. The probe body 12 with attached cantilever 50 is then placed in a scanning electron microscope (SEM) so that the ABS of body 12 with the gap 14 and two exposed ends of poles P1 and P2 face in the direction of the SEM electron beam source. A conventional SEM image is then taken of the pole ends and gap. Next, the electron beam is aligned precisely in the center of gap 14. While the electron beam remains focused at this location, residual gases and material in the vacuum chamber of the SEM form a deposit, which grows as a needle-like or generally conically-shaped tip in the gap region. The above-described deposition process using a SEM is referred to as electron beam-induced deposition (EBID) and is well known in the art. The EBID process is described for making AFM tips in IBM's U.S. Pat. No. 5,171,992 and the SEM apparatus for use in growing such tips is shown schematically in FIG. 5 of that patent. Typically, the material forming the tip is essentially a carbon matrix structure in which metal particles are dispersed, as described in the '992 patent.

Figure 4:
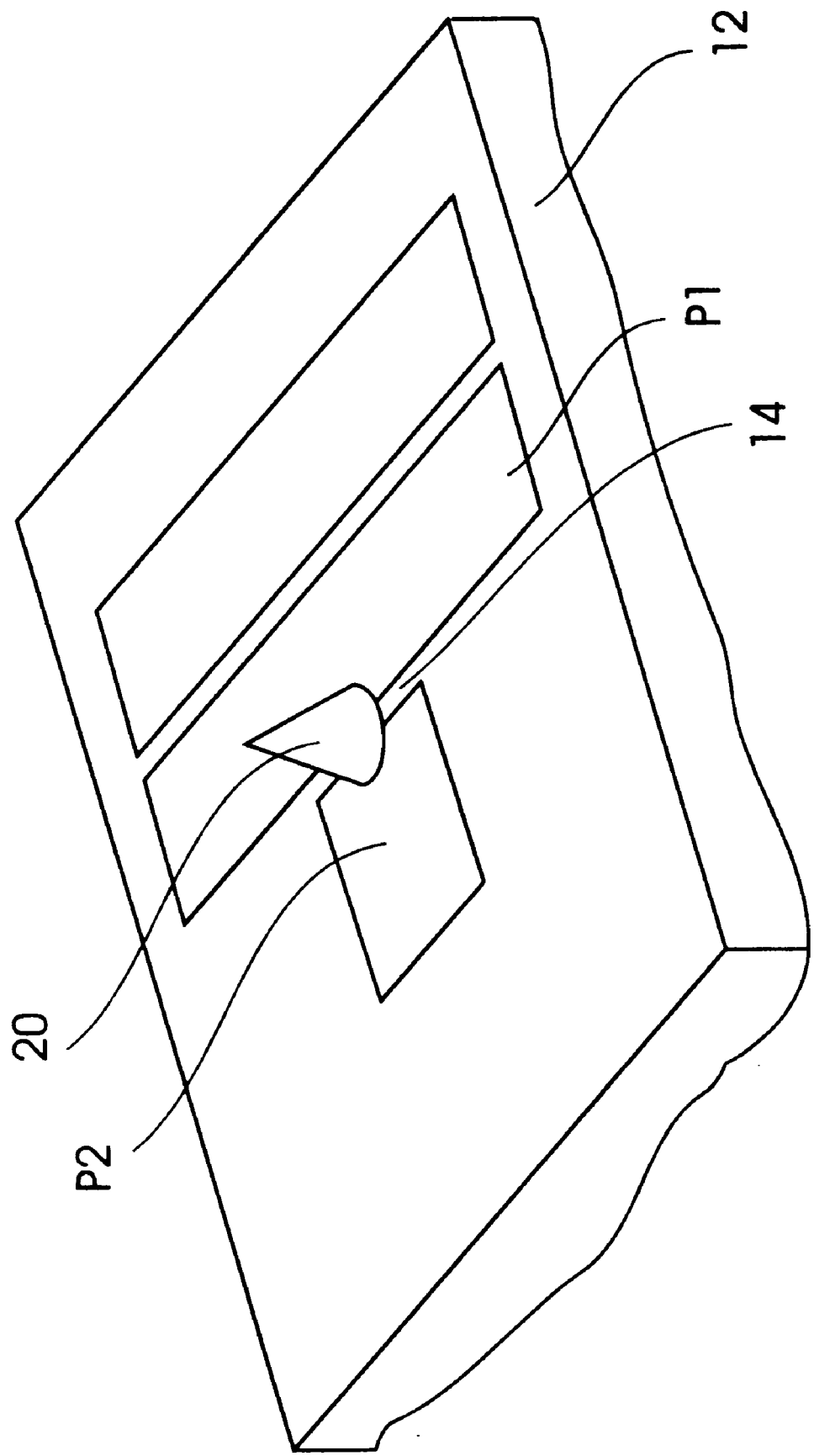
FIG. 4 is a perspective view of the air-bearing surface of a portion of a magnetic recording disk drive slider showing the location of the probe tip relative to the poles and gap of the inductive write head on the slider portion.

FIG. 4 is a perspective view of the end of probe body 12 showing the tip 20 after it has been grown in this manner over the gap 14 and at least one of the pole ends. The probe tip 20 grown in this manner has a length of approximately 1–2 microns.

Alternatively, the probe tip 20 can be grown onto the end of gap 14 and on the ends of the poles P1, P2 by depositing the desired material using evaporation, sputtering or electrodeposition through a lithographic mask, and then etching away the deposited material using focused ion beam (FIB) etching, to form the tip 20 in the desired shape. In this technique it is also possible to make the probe tip 20 entirely of magnetic material and formed in contact with only the gap and one of the poles so that the magnetic flux can be concentrated at the end of the probe tip.

Next, the cantilever 50 with probe 10 and its attached tip 20 is placed in a vacuum deposition chamber with the length of the tip 20 oriented generally perpendicular to the source of material to be deposited. A film of magnetic material, such as cobalt, is deposited from the direction of the source onto the tip 20 to form the surface layer 22 of ferromagnetic material on at least one side of the tip 20. In the preferred embodiment, 16 nm of cobalt are deposited, followed by 3 nm of platinum. The platinum provides corrosion protection for the underlying cobalt. The cobalt and platinum layers form the surface 22 shown in FIGS. 3A–3B. The cobalt and platinum layers can also be deposited by conventional evaporation or sputtering. As shown in FIG. 2A, it is important that the magnetic surface 22 on the tip 20 be in contact with at least one of the poles P1 or P2 so that the magnetic flux from that pole will be directed through the magnetic surface 22 of the tip 20 to the end of the tip. The magnetic surface 22 of the probe tip 20 can be formed of any ferromagnetic material, such as iron, cobalt and nickel and their alloys, including alloys such as CoPtCr, NiFe and SmCo. The magnetic surface can also be formed of paramagnetic materials, such as Pd and Pt, and superparamagnetic materials, such as small (approximately 4 nm diameter) Fe, Ni and Co particles.

In an alternative embodiment of the probe tip, the magnetic surface on the probe tip is patterned into two opposing portions. As shown in FIG. 5., two surfaces 23, 24 of a probe tip 20' are coated with ferromagnetic material. In this embodiment, the end of the tip has been removed so that there is no ferromagnetic material at the tip end between the two surfaces 23, 24. This allows magnetic flux to bridge the tip end from one magnetic surface 23 to the other magnetic surface 24. In this embodiment, each surface 23, 24 is formed so as to be in contact with a corresponding pole.

The advantage of the present invention is shown in FIGS. 6A–6B. In the prior art of FIG. 6A, the application of a magnetic field from an unshielded coil 82 to either the cantilever (not shown) or to the probe tip 80, as described and shown in FIG. 7 of the prior art U.S. Pat. No. 5,436,448, causes an interaction of the stray magnetic field from the coil 82 with the magnetic sample 60. In contrast, as shown in FIG. 6B, the field from the coil 11 of the present invention is shielded by the material surrounding the coil, including the gap 14 material and the poles P1, P2, so that the only magnetic field exposed to the sample 60 is precisely located in the region at the end of probe tip 20 where the field can interact with a small region of the magnetic sample 60.

Figure 7:
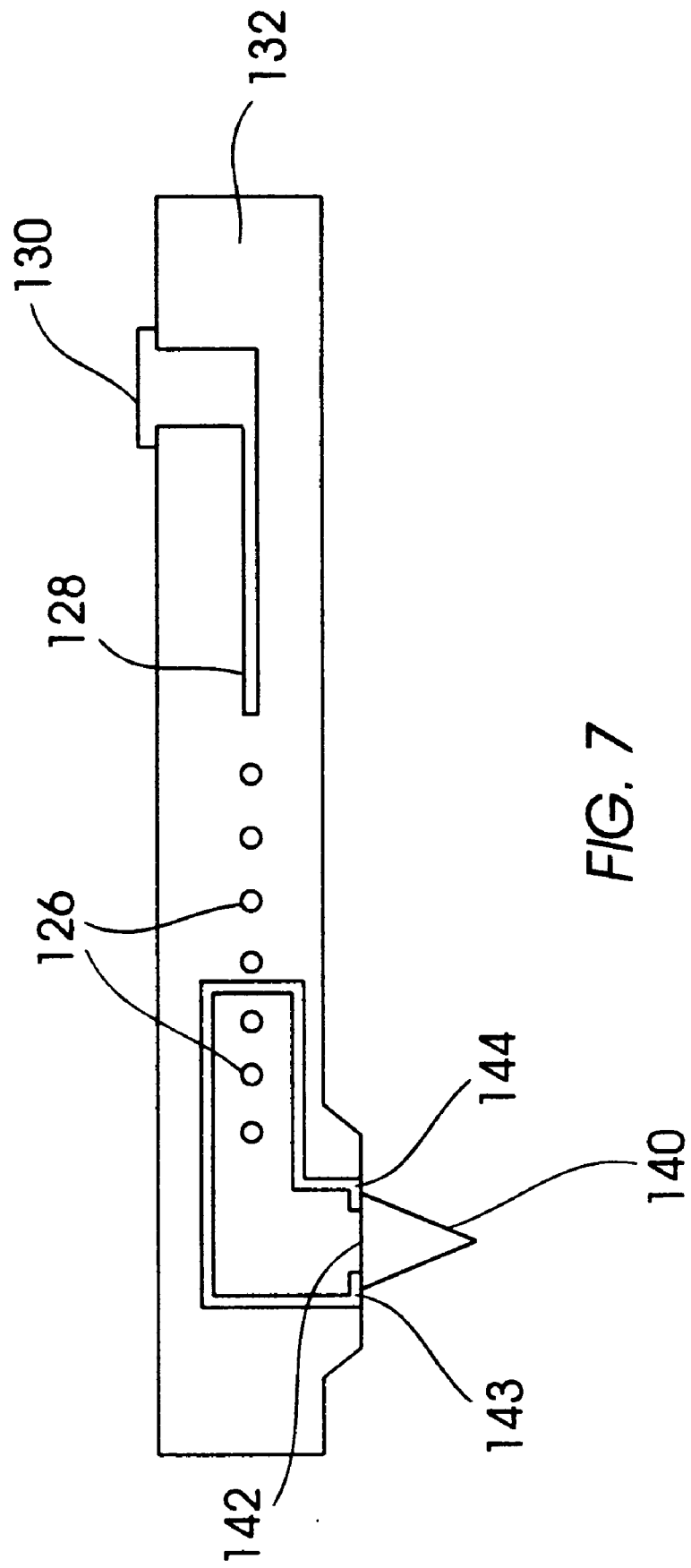
FIG. 7 is a side sectional view of an alternative embodiment of the AC-MFM probe formed as part of an integrated single-piece probe-cantilever.

As an alternative to the above described cantilever assembly of the cantilever and attached probe, the cantilever assembly can be formed as an integrated single-piece structure. For example, as shown and described in IBM's U.S. Pat. No. 5,454,158, an integrated suspension and contact probe with an inductive write head for contact magnetic recording is illustrated in FIGS. 3 and 10. This type of structure for use in the present invention is illustrated in FIG. 7, which is essentially the structure of FIG. 10 of the '158 patent with the wear layer removed and the probe tip 140 formed in the gap 142 between poles 143, 144. As shown in this embodiment, the tip 140 is formed in contact with the end of at least one of the poles 143, 144 and overlying gap 142. The structure of FIG. 7 is an integrated cantilever assembly wherein the coil 126 is shown in a plane generally parallel to the cantilever 132 and wound through the yoke that terminates at poles 143, 144. In this embodiment, the integrated cantilever assembly is fabricated in the same manner as that described in the '158 patent with the exception that the thickness of the cantilever 132 is made substantially thinner to provide greater flexibility for use in an MFM. The coil 126 is connected to electrical lead 128 that is formed inside the cantilever 132 and terminates at pad 130, where electrical connection can be made to the modulator 70 (FIG. 1). There is no need for a wear layer since the surface around tip 140 is not designed to be in contact for MFM applications. The probe tip 140 and magnetic surface on the tip are formed in the previously-described manner for the embodiment shown in FIGS. 2A–2B. Alternatively, the probe tip 140 may be formed using lithographic and etching techniques as part of the final steps of the fabrication of the complete structure. The integrated cantilever assembly of the present invention can also be fabricated using the manufacturing process and structure of the integrated suspension and inductive recording head shown and described in IBM's U.S. Pat. No. 5,486,963. In the '963 patent the coil layer is formed as two portions with one of the poles formed between the two coil layer portions so that the coil is thus wound around one of the poles.

While the preferred embodiments of the present invention have been illustrated in detail, it should be apparent that modifications and improvements may be made to the invention without departing from the spirit and scope of the invention as described in the following claims.

What is claimed is:

1. An alternating current type of magnetic force microscopy system for scanning the surface of a magnetic sample, the system comprising:

a sample holder;

a flexible cantilever;

a probe attached to the free end of the cantilever, the probe comprising a probe body, a pair of magnetic poles formed on the body, a layer of electrically conductive material formed on the body and patterned as a coil between the poles, and a probe tip attached to an end of one of the poles, the probe tip having a surface of magnetic material;

a source of alternating electrical current electrically connected to the probe coil for generating an alternating magnetic field at the probe tip;

a scanning stage for moving the sample holder relative to the probe tip, whereby the probe tip may scan various locations on the surface of the magnetic sample held by the sample holder; and a cantilever deflection detector for generating a signal representative of the magnetic field from a location on the surface of the magnetic sample, the interaction of the magnetic field from the magnetic sample and the alternating magnetic field at the probe tip causing the cantilever to deflect in opposite directions.

2. The system according to claim 1 wherein the magnetic surface of the probe tip consists of a ferromagnetic material selected from the group consisting of cobalt, iron, nickel and alloys of cobalt, iron or nickel.

3. The system according to claim 1 wherein the magnetic surface of the probe tip consists essentially of a paramagnetic or a superparamagnetic material.

4. The system according to claim 1 wherein the probe tip is attached to the ends of both poles, wherein the magnetic surface includes two surface portions, each surface portion being in contact with a corresponding pole, and wherein the end of the probe tip is nonmagnetic.

5. The system according to claim 1 wherein the probe tip is generally conically shaped with its base being at the end of the pole and its apex extending from the base.

6. The system according to claim 1 wherein substantially the entire probe tip is formed of magnetic material and is in contact with only one of the poles.

7. The system according to claim 1 wherein the probe body comprises a portion of a magnetic recording disk drive slider having an air-bearing surface, wherein the poles and the patterned coil are a thin film inductive write head patterned on the trailing end of the slider, and wherein the probe tip is attached to one of the poles near the slider air-bearing surface.

8. The system according to claim 1 wherein the coil is wound around one of the poles.

9. The system according to claim 1 wherein the two poles are interconnected to form a yoke and wherein the coil is wound around the yoke.

10. The system according to claim 1 wherein the cantilever is formed of silicon nitride.

11. The system according to claim 1 wherein the cantilever is formed of single crystal silicon.

12. The system according to claim 1 wherein the cantilever and probe body are formed as an integrated single-piece structure.

13. The system according to claim 1 wherein the patterned coil is formed in a plane generally parallel to the plane of the cantilever.

14. An alternating current type of magnetic force microscopy system for scanning the surface of a magnetic sample, the system comprising:

a sample holder;

a cantilever assembly comprising
        a flexible generally planar shaped cantilever;
        a layer of magnetic material formed as a yoke on the cantilever near the free end of the cantilever, the yoke having two poles;
        a layer of electrically conductive material formed on the cantilever and patterned as a coil between the poles; and
        a probe tip attached to an end of one of the poles and extending from the cantilever free end in a direction generally perpendicular to the plane of the cantilever, the probe tip having a surface of magnetic material; whereby when the coil is connected to a source of alternating electrical current the magnetic field induced in the yoke generates an alternating magnetic field at the probe tip;

a source of alternating electrical current electrically connected to the coil for inducing an alternating magnetic field in the yoke and thereby generating an alternating magnetic field at the probe tip;

a scanning stage for moving the sample holder relative to the probe tip, whereby the probe tip may scan various locations on the surface of the magnetic sample held by the sample holder; and a cantilever deflection detector for generating a signal representative of the magnetic field from a location on the surface of the magnetic sample, the interaction of the magnetic field from the magnetic sample and the alternating magnetic field at the probe tip causing the cantilever to deflect in opposite directions.

15. The system according to claim 14 wherein the coil is formed in a plane generally parallel to the plane of the cantilever.

16. The system according to claim 14 wherein the layer of electrically conductive material patterned as a coil is formed as two layer portions with the layer of magnetic material formed as a yoke being located between the two coil layer portions.

* * * * *